(12) United States Patent
Wortel

(10) Patent No.: US 6,906,587 B2
(45) Date of Patent: Jun. 14, 2005

(54) CURRENT CONTROLLED BRIDGE AMPLIFIER

(75) Inventor: Klaas Wortel, Phoenix, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 132 days.

(21) Appl. No.: 10/355,859

(22) Filed: Jan. 31, 2003

(65) Prior Publication Data

US 2004/0150474 A1 Aug. 5, 2004

(51) Int. Cl.$^7$ ................................................. H03F 3/45
(52) U.S. Cl. ................................. 330/253; 330/207 A
(58) Field of Search ................................. 330/253, 258, 330/311, 10, 251, 207 A

(56) References Cited

U.S. PATENT DOCUMENTS

| | | | |
|---|---|---|---|
| 5,564,668 A | | 10/1996 | Crowe, II |
| 6,005,438 A | * | 12/1999 | Shing ........................ 330/253 |
| 6,211,735 B1 | | 4/2001 | Luu |
| 6,252,787 B1 | | 6/2001 | Zappacosta, II |
| 6,545,533 B2 | * | 4/2003 | Karki et al. .................. 330/10 |
| 6,642,790 B2 | * | 11/2003 | Schrodinger et al. ....... 330/253 |
| 6,664,853 B1 | * | 12/2003 | Sun et al. .................... 330/253 |

* cited by examiner

Primary Examiner—Henry Choe
(74) Attorney, Agent, or Firm—Meyertons Hood Kivlin Kowert & Goetzel, P.C.; Jeffrey C. Hood; Erik A. Heter

(57) ABSTRACT

An amplifier circuit. In one embodiment, the amplifier includes a first pair of transistors and a second pair of transistors. Each transistor in the amplifier includes a control terminal (e.g. a gate) as well as a first and second terminals. In one embodiment, the transistors are field effect transistors (FETs) and thus the first and second terminals may be either source or drain terminals. First terminals of each of the first pair of transistors may be coupled to a voltage source. The first terminal of each of the second pair of transistors is coupled to the second terminal of one of the first pair of transistors. A current source may be coupled between each of the second terminals and a voltage reference (e.g. ground plane).

20 Claims, 4 Drawing Sheets

_US 6,906,587 B2_

CURRENT CONTROLLED BRIDGE AMPLIFIER

FIELD OF THE INVENTION

This invention relates to electronic circuits, and more particularly, to amplifier circuits for transmitting signals in low power wireless devices.

DESCRIPTION OF THE RELATED ART

Many portable electronic devices (e.g. cellular telephones, personal digital assistants) operate on battery power. Such battery operated devices need to be prudent with current use. Furthermore, in devices having analog circuitry, interference between circuits must be prevented or minimized.

One of the major consumers of power in portable electronic devices is the transmitter stage amplifier. The transmitter stage amplifier of a wireless device is required to consume enough power for transmitting a signal through the "air" to its intended destination. For non-wireless devices, the transmitter stage may be required to consume enough power to transmit a signal over whatever particular transmission medium is being used.

One type of transmitter amplifier that is commonly used is a bridge amplifier. A bridge amplifier may be highly efficient in transferring transmit power to its load. However, the current draw of this type of amplifier is not constant. The varying current in such an amplifier may cause interference with other nearby circuits and thus adversely affect their operation. Furthermore, power transferred to the circuit load is at or near its maximum at nearly all times. Thus, power consumption may tend to be high, and battery life may be adversely impacted.

Another type of transmitter amplifier is known as a differential pair. Differential pair amplifiers typically have inductive loads. These inductive loads may require expensive and bulky external components for some lower frequencies. At higher frequencies, the inductive loads may be integrated onto a die with the rest of the amplifier circuitry, but at the cost of a significant amount of die area. Alternatively, the inductive loads may be replaced with current sources that may omit the use of inductors, but may reduce the efficiency of the circuit and adversely impact battery life.

SUMMARY OF THE INVENTION

An amplifier circuit is disclosed. In one embodiment, the amplifier includes a first pair of transistors and a second pair of transistors. Each transistor in the amplifier includes a control terminal (e.g. a gate) as well as first and second terminals. In one embodiment, the transistors are field effect transistors (FETs) and thus the first and second terminals may be either source or drain terminals. First terminals of each of the first pair of transistors may be coupled to a voltage source. The first terminal of each of the second pair of transistors is coupled to the second terminal of one of the first pair of transistors. A current source may be coupled between each of the second terminals and a voltage reference (e.g. ground plane), and may ensure that the current draw of the amplifier is substantially constant. The amplifier may be used as a transmission amplifier to transmit signals through an antenna to a wireless device.

In one embodiment, the transistors may be field-effect transistors (FETs), with the first pair of transistors being P-channel FETs and the second pair of transistors being N-channel FETs. The amplifier may be coupled to receive a differential input signal. In one embodiment, the control terminals of each of the first pair of transistors may be coupled to a control terminal of one of the second pair of transistors, thereby forming control terminal junctions between each of the transistor pairs. In another embodiment, a third pair of transistors includes a junction at the control terminals and a fourth pair of transistors also includes a junction at the control terminals, with a delay circuit present between the third pair of transistors and the first and second pairs, as well as between the fourth pair of transistors.

In general, the amplifier may be a hybrid amplifier having characteristics of a bridge amplifier and a differential pair amplifier. The amplifier may have a relatively high efficiency while being able to maintain a relatively constant current, thereby reducing or eliminating the generation of unwanted supply current modulation that may cause interference with other nearby circuits.

A differential load may be coupled between the junctions between the second terminals of the first pair of transistors and the first terminals of the second pair of transistors. In one embodiment, the load may be an antenna. In another embodiment, the load may be a differential-to-single converter that converts the amplified differential signal to a single ended signal for transmission on a wire-type antenna.

BRIEF DESCRIPTION OF THE DRAWINGS

Other aspects of the invention will become apparent upon reading the following detailed description and upon reference to the accompanying drawings in which.

Figure 1A:
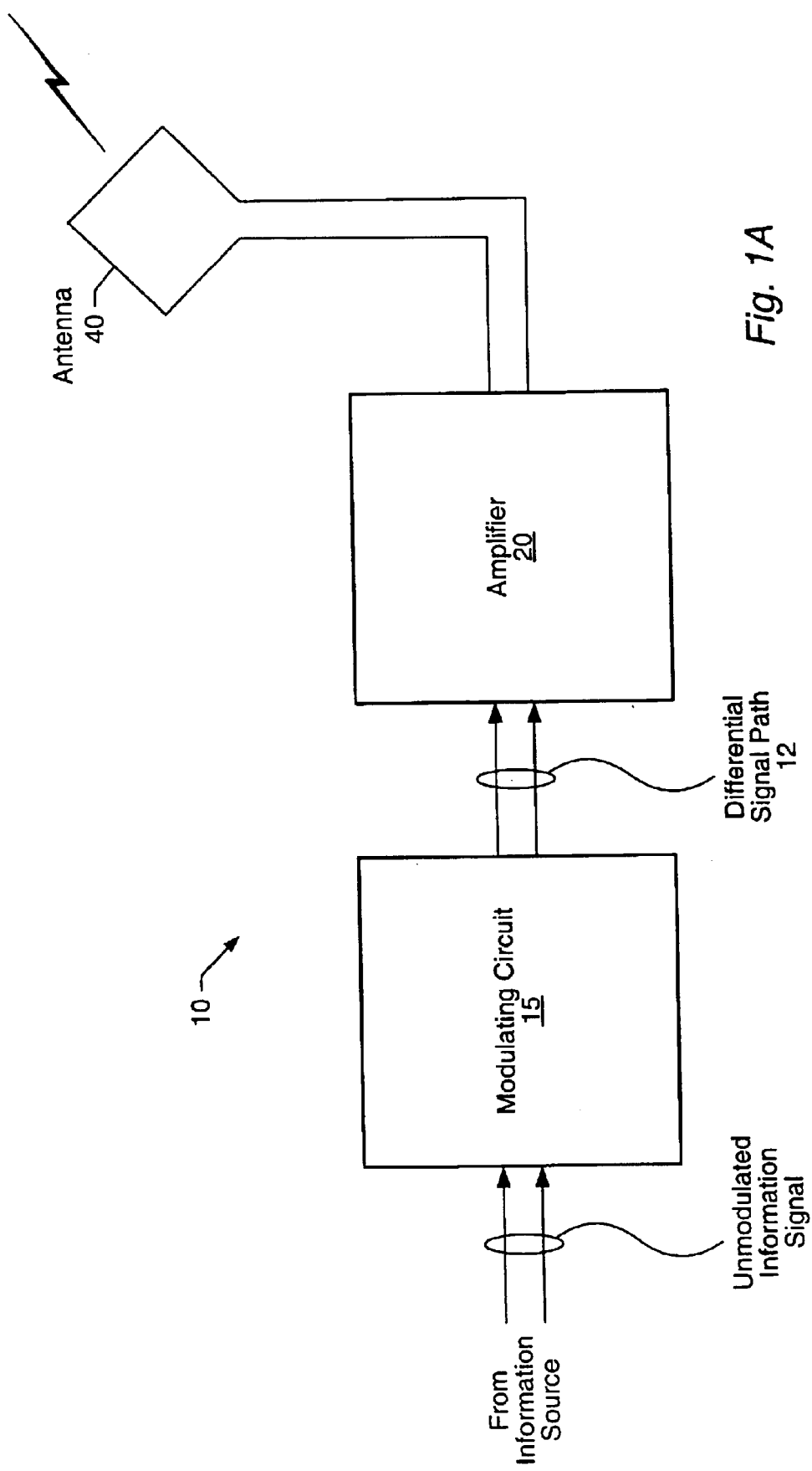
FIG. 1A is a block diagram of one embodiment of a wireless device.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1A, a block diagram of one embodiment of a wireless transmission device is shown. Wireless transmission device 10 includes a modulating circuit 15, which is coupled to amplifier 20. It is noted that wireless transmission device 10 may have other components than those explicitly shown here. Amplifier 20 is coupled to antenna 40, which is a loop-type antenna in this particular embodiment. Wireless transmission device 10 may be virtually any type of wireless device configured to transmit signals over the airwaves. For example, wireless transmission device may be a wireless keyboard, a wireless mouse, or a wireless/cordless telephone.

Modulating circuit 15 may be coupled to receive a differential input signal from an information source. The received information signal may be mixed with a signal at a carrier frequency for transmission from wireless transmission device 10. One of several commonly known modulation techniques may be performed by modulating circuit 15, such as quadrature modulation, frequency shift keying (FSK), or other well-known types. Modulating circuit 15 may convey the modulated signal to amplifier 20 via differential signal path 12.

Amplifier 20 may receive the modulated signal and amplify it to a level sufficient for transmission. In the embodiment shown, amplifier 20 may transmit the signal via antenna 40, which is a loop antenna suitable for transmitting a differential signal in this embodiment and serves as the load for this implementation of wireless transmission device 10. Amplifier 20 may include two or more pairs of transistors and a current source. The current source may help ensure a substantially constant current draw by amplifier 20. Amplifier 20 will be discussed in greater detail below.

Figure 1B:
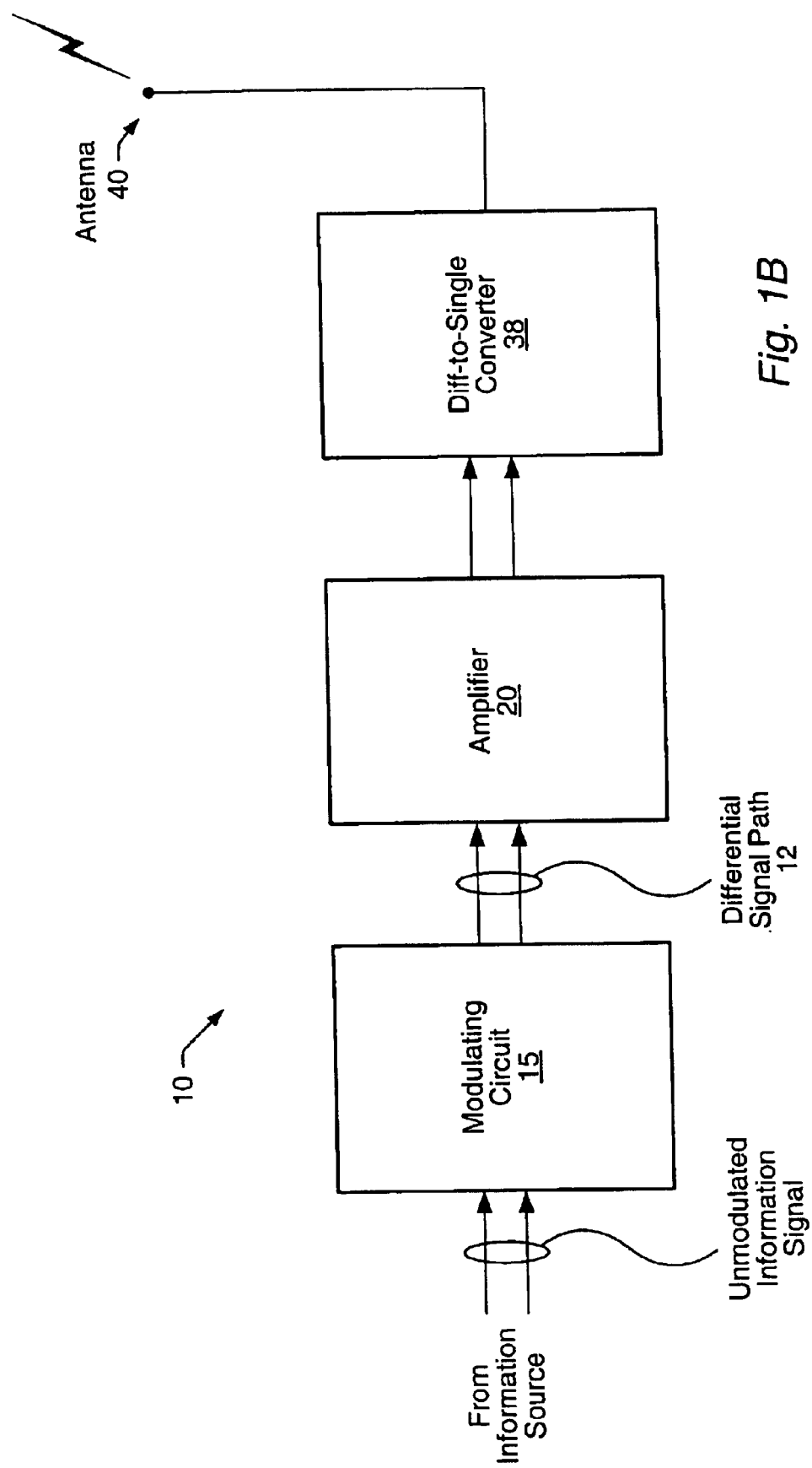
FIG. 1B is a block diagram of an alternate embodiment of a wireless device.

Moving now to FIG. 1B, a block diagram of an alternate embodiment of wireless transmission device 10 is shown. As with the previous embodiment, wireless transmission device 10 includes a modulating circuit 15, an amplifier 20 and an antenna 40, which is a wire antenna in this embodiment. A differential-to-single converter 38 is coupled between amplifier 20 and antenna 40. Differential-to-single converter 38 may convert the modulated differential signal output by amplifier 20 to a single-ended signal suitable for transmission on antenna 40.

Figure 2A:
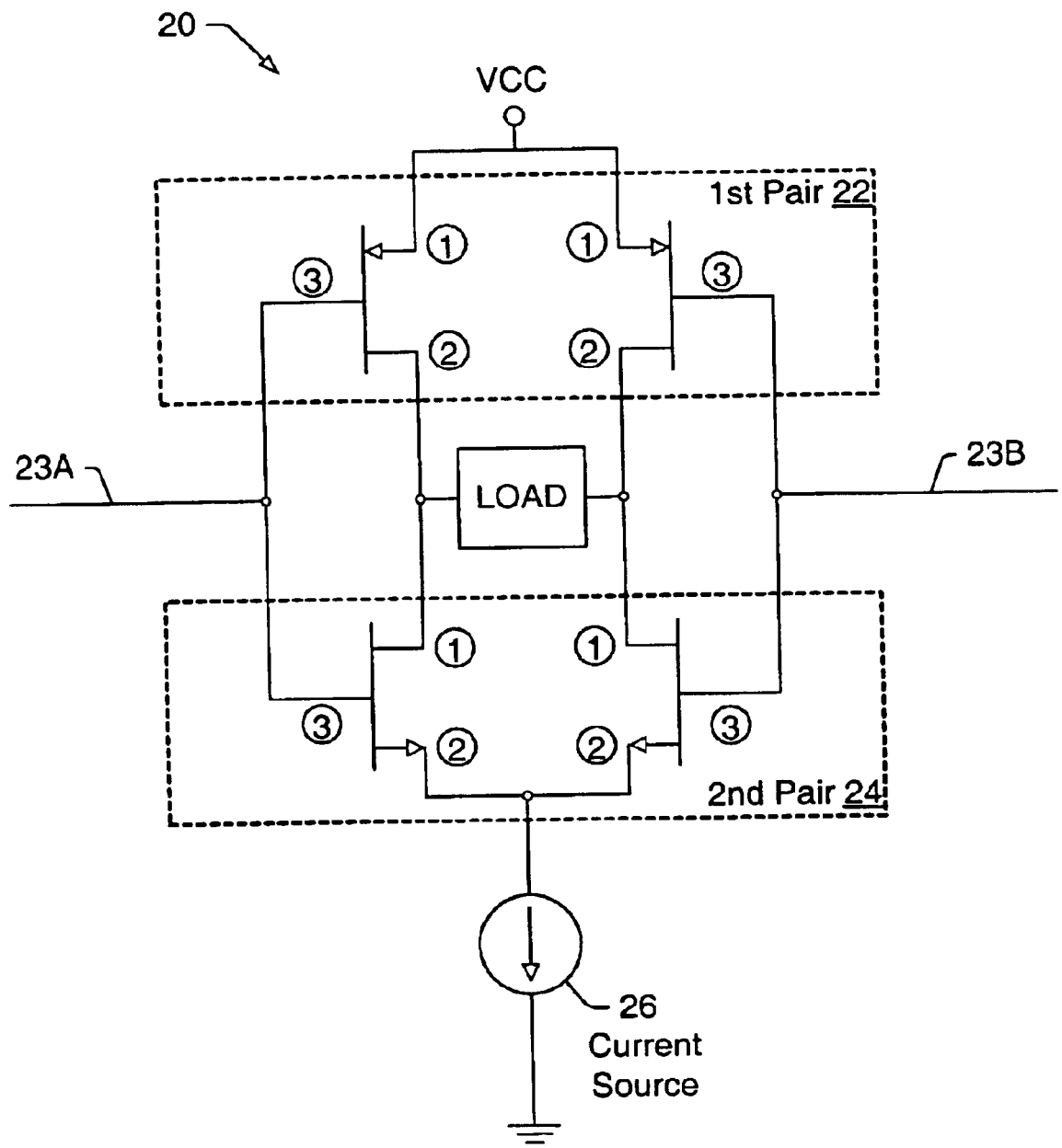
FIG. 2A is a schematic diagram of one embodiment of a transmitter amplifier circuit.

FIG. 2A is a schematic diagram of one embodiment of amplifier circuit 20. In the embodiment shown, amplifier circuit 20 includes first pair of transistors 22 and second pair of transistors 24. In the embodiment shown, the transistors of each pair are field-effect transistors (FETs), although embodiments using bipolar transistors are possible and contemplated. Each transistor includes a first terminal (1), a second terminal (2) and a control terminal (3). Since the transistors are FETs in this embodiment, the control terminal for each transistor is a gate. The transistors of the first pair in this particular embodiment are P-channel FETs, and thus their first terminals are source terminals while their second terminals are drain terminals. The transistors of the second pair are N-channel FETs, and thus their first terminals are drain terminals while the second terminals are source terminals. Embodiments using the opposite polarity for the transistor pairs are possible and contemplated.

Amplifier 20 may be configured to receive a differential input signal. One half of the differential signal may be received on signal line 23A, which is coupled to a junction between the gate terminals of one of first transistor pair 22 and one of second transistor pair 24. The other half of the differential signal may be received by signal line 23B, which is coupled to the junction between the gates of the other transistors of first transistor pair 22 and second transistor pair 24. Since the transistors are of opposite polarity, each half of the differential signal may activate one or the other of the transistors upon whose gate the differential signal half is received.

The differential signal received by amplifier 20 may be transmitted onto a differential load, referred to as "load" in FIG. 2A. In the embodiment shown, the differential load ("load") is coupled to a junction that is located between the drain terminals of the first pair of transistors and the source terminals of the second pair of transistors. Thus, a transmission signal path exists for each half of the differential signal to be transmitted.

The load onto which the differential signal may be transmitted is an antenna in one embodiment. The antenna may be a loop antenna as shown in FIG. 1A, and transmission of the signal onto the antenna may result in the signal being radiated over the airwaves. In another embodiment, the load may be a differential-to-single converter such as that illustrated in FIG. 1B, which converts a differential signal into a single ended signal prior to transmitting.

Amplifier 20 includes current source 26, which is coupled between a voltage reference (e.g. ground plane) and the source terminals of the transistors that make up second transistor pair 24. Current source 26 may regulate the current drawn by amplifier 20 such that it is substantially constant during operation of the wireless device in which it is implemented. The substantially constant current draw may be maintained despite any particular pattern of information that may be received by amplifier 20 for transmission. Keeping the current draw substantially constant may reduce or eliminate the generation of unwanted supply current modulation by amplifier 20 and thus prevent interference with any nearby circuits.

Figure 2B:
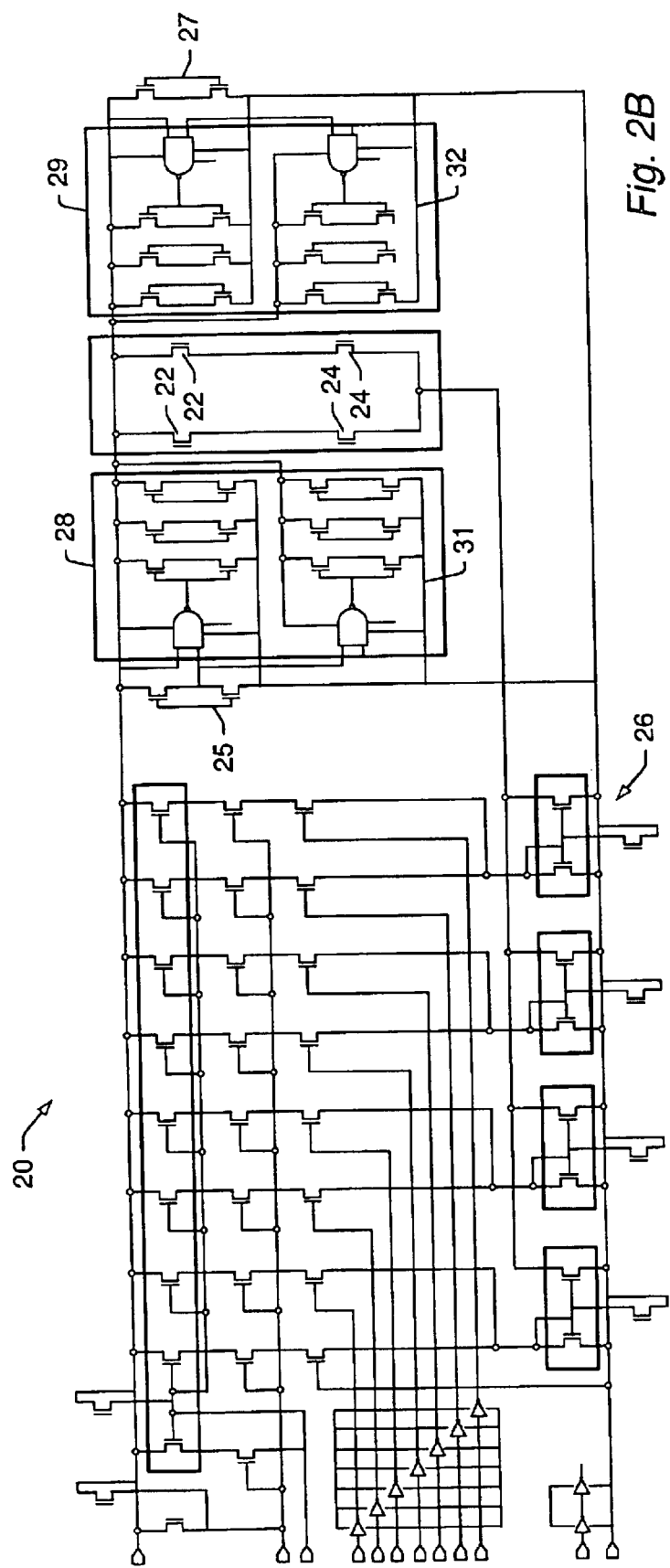
FIG. 2B is a schematic diagram of another embodiment of a transmitter amplifier circuit.

Moving now to FIG. 2B, a schematic diagram of another embodiment of amplifier 20 is shown. In the embodiment shown, amplifier 20 works on a similar principle as the embodiment shown in FIG. 2B. This particular embodiment includes third transistor pair 25 and fourth transistor pair 27 in addition to first transistor pair 22 and second transistor pair 24. A load may be coupled to the first and second transistor pairs in a manner similar to that illustrated in FIG. 2A.

Each of the third and fourth transistor pairs may receive one half of the differential signal. Both third transistor pair 25 and fourth transistor pair 27 include two transistors of opposite polarity that include a common junction connected to their respective gate terminals (similar to the junctions which signal lines 23A and 23B are coupled to in the embodiment of FIG. 2A). Similarly, a junction between the source terminal of one transistor and the drain terminal of the other may exist for each of the transistors of third transistor pair 25 and fourth transistor pair 27.

After the differential signal is received by the third and fourth transistor pairs, it may be conveyed to the first and second transistor pairs through delay circuits. The embodiment shown includes delay circuits 28 and 31 coupled between third transistor pair 25 and the first and second transistor pairs. Similarly, delay circuits 29 and 32 are coupled between fourth transistor pair 27 and the first and second transistor pairs. Each of the delay circuits may be coupled to activate or deactivate one of the transistors of either first or second transistor pairs.

FIG. 2B illustrates in greater detail one embodiment of current source 26 which may be used with amplifier 20. In the embodiment shown, current source 26 is a programmable current source. Current source 26 includes a plurality of inputs that may activate or deactivate transistors within the circuit to allow a certain amount of current to be drawn by amplifier 20. In the embodiment shown, the inputs to current source 26 may change as necessary to ensure that the overall current draw by the amplifier remains substantially constant despite changing operating conditions.

In various embodiments, including both those of FIGS. 2A and 2B, the fully integrated power amplifier circuit is designed to be highly efficient with a high degree of current control. The circuit may combine the characteristics of a highly efficient hybrid amplifier (which lacks current control) with the characteristics of a fully integrated, well-controlled (but low efficiency) differential pair amplifier. The relatively high efficiency of the circuit may make it useful for applications in battery-operated equipment. The substantially constant current draw of the circuit may minimize interference with surrounding circuits on the same die or elsewhere within the device in which it is implemented.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An amplifier circuit comprising:
    a first pair of transistors and a second pair of transistors, wherein each of the first pair of transistors and the second pair of transistors includes a first terminal, a second terminal, and a control terminal, wherein the first terminal of each of the first pair of transistors is coupled to a voltage source, and wherein the second terminal of each of the first pair of transistors is coupled to the first terminal of a respective one of the second pair of transistors;
    a load coupled between the second terminals of the first pair of transistors; and
    a current source, coupled between a voltage reference and the second terminal of each of the second pair of transistors;
    wherein the current source is configured to generate a current; and
    wherein the amplifier circuit is operable to:
        route the current from a first one of the first pair of transistors to a first one of the second pair of transistors, and
        route the current from a second one of the first pair of transistors to a second one of the second pair of transistors.

2. The amplifier circuit as recited in claim 1, wherein the current is substantially constant.

3. The amplifier circuit as recited in claim 1, wherein each of the first pair of transistors and each of the second pair of transistors comprise field-effect transistors (FETs).

4. The amplifier circuit as recited in claim 3, wherein the polarity of each of the first pair of transistors is opposite of the polarity of each of the second pair of transistors.

5. The amplifier circuit as recited in claim 4, wherein each of the first pair of transistors is a P-channel FET and each of the second pair of transistors is an N-channel FET.

6. The amplifier circuit as recited in claim 1, wherein the load is an antenna.

7. The amplifier circuit as recited in claim 1, wherein the amplifier circuit includes a differential input pair, wherein a first one of the input pair is coupled to the control terminal of the first one of the first pair of transistors and to the control terminal of the second one of the second pair of transistors, and wherein a second one of the input pair is coupled to the control terminal of the second one of the first pair of transistors and to the control terminal of the first one of the second pair of transistors.

8. The amplifier circuit as recited in claim 1, wherein the current source is a programmable current source.

9. The amplifier circuit as recited in claim 1, further comprising:
    a third pair of transistors and a fourth pair of transistors, wherein a control terminal of a first transistor of the third pair is coupled to a control terminal of a second transistor of the third pair, and wherein a control terminal of a first transistor of the fourth pair is coupled to a control terminal of a second transistor of the fourth pair;
    a first delay circuit and a second delay circuit, wherein the first delay circuit is coupled between the third pair of transistors and at least one transistor of either the first pair or second pair of transistors, and wherein the second delay circuit is coupled between the fourth pair of transistors and at least one of the first pair or second pair of transistors.

10. A wireless transmission device comprising:
    a modulator, wherein the modulator is configured to modulate an information signal; and
    an amplifier circuit coupled to the modulator, and configured to:
        receive a modulated signal corresponding to the information signal subsequent to the modulator modulating the information signal; and
        transmit the modulated signal via an antenna, wherein the amplifier circuit comprises:
            a first pair of transistors and a second pair of transistors, wherein each of the first pair of transistors and the second pair of transistors includes a first terminal, a second terminal, and a control terminal, wherein the first terminal of each of the first pair of transistors is coupled to a voltage source, and wherein the second terminal of each of the first pair of transistors is coupled to the first terminal of one respective one of the second pair of transistors; and
            a current source configured to generate a current, wherein the current source is coupled between a voltage reference and the second terminal of each of the second pair of transistors;
        wherein the amplifier circuit is operable to:
            route the current from a first one of the first pair of transistors to a first one of the second pair of transistors, and
            route the current from a second one of the first pair of transistors to a second one of the second pair of transistors.

11. The wireless transmission device as recited in claim 10, wherein the current is substantially constant.

12. The wireless transmission device as recited in claim 10, wherein each of the first pair of transistors and each of the second pair of transistors are field-effect transistors (FETs).

13. The wireless transmission device as recited in claim 12, wherein the polarity of each of the first pair of transistors is opposite of the polarity of each of the second pair of transistors.

14. The wireless transmission device as recited in claim 13, wherein each of the first pair of transistors is a P-channel FET and each of the second pair of transistors is an N-channel FET.

15. The wireless transmission device as recited in claim 10, wherein a load is coupled between the second terminals of the first pair of transistors.

16. The wireless transmission device as recited in claim 15, wherein the load is the antenna.

17. The wireless transmission device as recited in claim 10, wherein the amplifier circuit includes a differential input pair, wherein a first one of the input pair is coupled to the control terminals of one of the first pair and one of the second pair of transistors, and wherein a second one of the input pair is coupled to the control terminals of the other one of the first pair and other one of the second pair of transistors.

18. The wireless transmission device as recited in claim 10, wherein the current source is a programmable current source.

19. The wireless transmission device as recited in claim 10, further comprising a differential-to-single converter coupled between the amplifier and the antenna, wherein the differential to single converter is configured to convert differential signals to single-ended signals.

20. The amplifier circuit as recited in claim 1, wherein;
the amplifier circuit is operable to:
route the current from the first one of the first pair of transistors to the first one of the second pair of transistors through the load, and
route the current from the second one of the first pair of transistors to the second one of the second pair of transistors through the load.

* * * * *